(12) United States Patent
Gupta (10) Patent No.: US 6,876,186 B1
(45) Date of Patent: Apr. 5, 2005

(54) MEASUREMENT OF CIRCUIT DELAY

(75) Inventor: Chandrasekaran N. Gupta, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 42 days.

(21) Appl. No.: 10/651,809

(22) Filed: Aug. 29, 2003

(51) Int. Cl.[7] .................. G01R 23/175; G01R 31/26
(52) U.S. Cl. .................. 324/76.54; 324/76.52; 324/765; 327/152; 327/269; 365/194
(58) Field of Search .................. 324/76.52, 76.54, 324/763–765; 714/718, 731, 744, 814; 327/152, 269; 365/194, 201

(56) References Cited

U.S. PATENT DOCUMENTS 6,788,594 B2 * 9/2004 Ware et al. .................. 365/194
6,812,727 B2 * 11/2004 Kobayashi .................. 324/765

* cited by examiner

Primary Examiner—Vincent Q. Nguyen
(74) Attorney, Agent, or Firm—W. Eric Webostad (57) ABSTRACT

Method and apparatus for determining delay of a circuit. A clock signal is provided to a variable delay and then to the circuit. The clock signal obtained from the circuit is provided to a data register, such as a flip-flop, as a clock input. The clock signal is provided to the flip-flop as a data input. Output of the data register is provided to a controller to incrementally adjust phase shift until the data input and clock input are substantially aligned in phase. All incremental adjustments in phase shift are counted to provide an indication of delay of the circuit.

2 Claims, 7 Drawing Sheets

MEASUREMENT OF CIRCUIT DELAY

FIELD OF THE INVENTION

One or more aspects of the invention relate generally to measurement of circuit delay and more particularly, to dynamic measurement of circuit delay.

BACKGROUND OF THE INVENTION

For placement and routing of integrated circuits, as well as other design functions, it is necessary to meet timing parameters based on certain assumptions about circuit delay. However, conventionally, delay of a signal through transistor gates in an integrated circuit varies with voltage, temperature and process. Thus, assumptions about timing may need to be varied based on actual performance of an integrated circuit within an operating environment.

Clock phase or clock period is conventionally used to measure composite delay through similar logic elements. A total delay for a whole clock phase is then divided into the number of logic elements used to achieve such a whole clock phase delay. This division results in a delay value ascribed to each individual delay element, such as for a delay line in a delay locked loop ("DLL"). This solution is satisfactory for a significant number of same circuit elements chained together in series and matched with respect to process, voltage and temperature. However, this is not meaningful with respect to disparate circuit elements, which may not be chained together in series and which may have voltage, temperature and process variation differences.

Accordingly, it would be desirable and useful to be able to characterize delay of circuit elements of an integrated circuit within an operating environment.

SUMMARY OF THE INVENTION

An aspect of the invention is a method for delay calibration, comprising: obtaining a reference clock signal; determining a setup time for a data register; obtaining a circuit to be calibrated; programmably coupling a phase shifter on an input side of the circuit to be calibrated and the data register on an output side of the circuit to be calibrated; initializing delay to a reference; determining output state of the data register in response to the reference clock signal as data input of the data register and a phase-shiftable version of the reference clock signal as clock input of the data register, the phase-shiftable version of the reference clock signal provided by passing the reference clock signal through the phase shifter and then, from output of the phase shifter, through the circuit to be calibrated; and incrementally adjusting phase shift of the phase-shiftable version of the reference clock signal to bring phase of the clock input within a target range of phase of the data input.

Another aspect of the invention is a delay calibration system, comprising: a variable delay circuit configured to receive a clock signal and provide a delayed clock signal; a circuit to be calibrated coupled to receive the delayed clock signal from the variable delay; a register coupled to receive the delayed clock signal after passing through the circuit as a clock input signal and to receive the clock signal as a data input signal, the register configured to provide the output signal responsive to the data input signal and the clock input signal; and a control circuit coupled to receive an output signal from the register, the control circuit configured to provide a delay adjustment signal to adjust the variable delay circuit to adjust delay of the delayed clock signal.

Another aspect of the invention is a method of determining setup time of a data register for a delay calibration system, comprising: obtaining a reference clock signal; obtaining a variable delay; programmably coupling the variable delay to the data register; providing the reference clock signal to the variable delay to phase shift the reference clock signal to provide a phase-shifted clock signal; providing the reference clock signal as data to the data register; providing the phase-shifted clock signal to the data register as a clock input; generating a feedback output signal from the data register responsive to the phase-shifted clock signal and the reference clock signal; and determining whether to adjust phase shift of the phase-shifted clock signal.

Another aspect of the invention is a method for delay calibration, comprising: obtaining a reference clock signal; determining a setup time for a data register; obtaining a circuit to be calibrated; programmably coupling a phase shifter on an input side of the circuit to be calibrated and the data register on an output side of the circuit to be calibrated; initializing delay to a reference; determining output state of the data register in response to the reference clock signal as data input of the data register and a phase-shiftable version of the reference clock signal as clock input of the data register, the phase-shiftable version of the reference clock signal provided by passing the reference clock signal through the phase shifter and then, from output of the phase shifter, through the circuit to be calibrated; and incrementally adjusting phase shift of the phase-shiftable version of the reference clock signal to bring phase of the clock input within a target range of phase of the data input.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
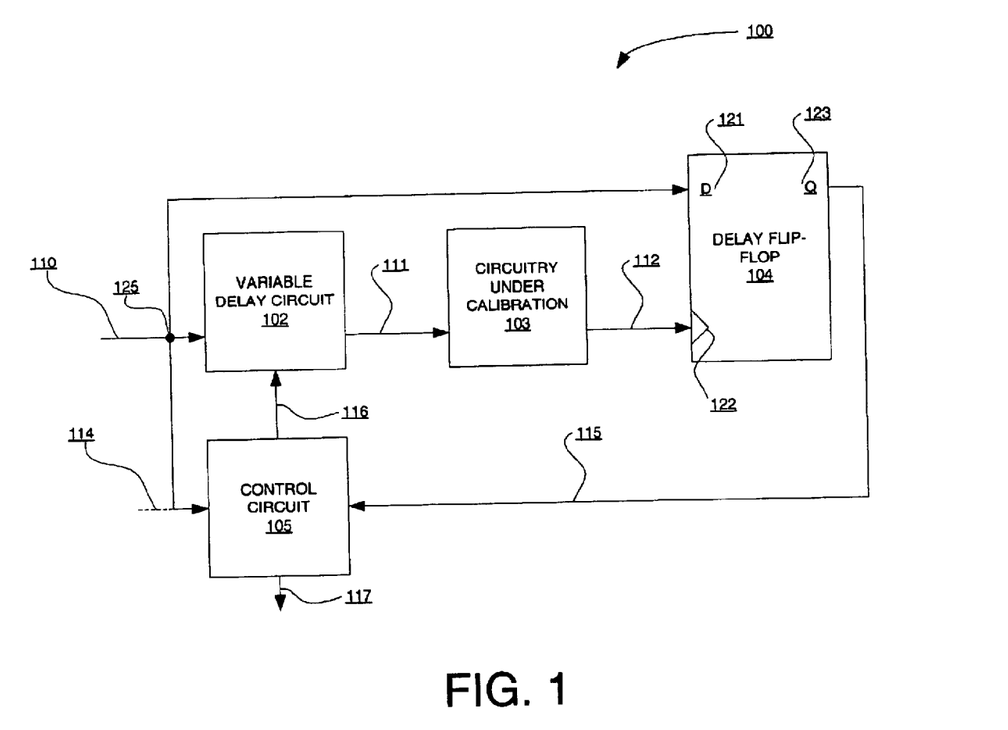
FIG. 1 is a block diagram depicting an exemplary embodiment of a delay calibration system.

FIG. 1 is a block diagram depicting an exemplary embodiment of a delay calibration system 100. Delay calibration system 100 includes a variable delay circuit 102, circuitry under calibration 103, a delay flip-flop 104, and a control circuit 105. In an embodiment, circuitry under calibration 103 includes only one or more non-clocked circuit elements, such as one or more combinatorial logic elements. In another embodiment, circuitry under calibration 103 includes one or more clocked circuit elements, and may additionally include one or more non-clocked circuit elements. However, for purposes of clarity and not limitation, circuitry under calibration 103 is described herein below as having only one or more non-clocked circuit elements, as it will be apparent to one of ordinary skill that one or more clocked circuit elements may be used as well.

Variable delay circuit 102 is a phase shifter. Variable delay circuit 102 may shift phase of a reference clock signal, such as clock signal 110, in a positive or negative direction. In a well-known programmable logic device ("PLD"), a digital clock manager or module ("DCM") may be included that shifts phase of a clock in a positive or negative direction in incremental steps using taps off of a DLL. However, delay calibration system 100 may be included in a PLD or other well-known integrated circuit.

Control circuit 105 provides several functions, including: providing delay adjust signal 116 for adjustment of the variable delay of variable delay circuit 102; sampling output 115 of delay flip-flop 104 to determine if it is a one or a zero; and determining the delay of circuitry under calibration 103 for adjust to align rising edge to rising edge, or falling edge to falling edge, of clock signal 110 to calibration clock signal, such as clock signal 112. Clock signal 112 may be calibrated within a target range. Notably, granularity of steps of phase shift, such as fixed increments of delay, of variable delay circuit 102 will affect alignment precision. Thus, a target range may be used. Alternatively, if a continuously variable phase shifter is used for variable delay circuit 102, a more precise alignment may be obtained. For clarity, between clock signal 112 provided to input clock pin 122 of delay flip-flop 104 and clock signal 110 provided as data to input data pin 121 of delay flip-flop 104, clock signal 110 provided to input data pin 121 of delay flip-flop 104 is referred to as data signal 110. Though a delay type flip-flop is described, it should be appreciated that other types of clocked registers may be used.

Clock signal 110 is provided to variable delay circuit 102 and control circuit 105. This facilitates clock synchronization among input clocks of delay calibration system 100. Alternatively, a separate clock signal 114 may be provided to control circuit 105. For example, a clock signal 114 having a frequency greater than that of clock signal 110 may be used to increase sampling frequency. Notably, to improve precision, delay due to traces for clock signals, such as clock signal 110 from node 125 to input data pin 121, may be minimized. However, in application, trace delay may be small in comparison to delay associated with circuitry under calibration 103.

In operation, clock signal 110 provided to variable delay circuit 102 is phase shifted to provide clock signal 111. A "delayed" clock signal, such as clock signal 111, is provided to circuitry under calibration 103. Notably, it is possible that in instances variable delay circuit may be set to zero delay when providing a "delayed" clock signal, such as clock signal 111. Propagation delay of clock signal 111 due to circuitry under calibration 103 produces a delayed clock signal, namely, clock signal 112. Clock signal 112 and data signal 110 are provided to delay flip-flop 104, which in response provides output 115 as feedback input ("feedback signal 115") to control circuit 105. Notably, if trace delay is significant, trace length from output pin 123 of delay flip-flop 104 to input of control circuit 105 may be minimized, as control circuit 105 operates in partial response to clock signal 110, as described below in additional detail.

In response to feedback signal 115, control circuit 105 adjusts delay of variable delay circuit 102 via delay adjust signal 116. In other words, delay adjust signal 116 is produced by control circuit 105 in response to clock signal 110 and feedback signal 115. Control circuit 105 produces a total delay signal 117 in response to the amount of adjustment used to bring clock signal 112 and data signal 110 within a target range.

Figure 2A:
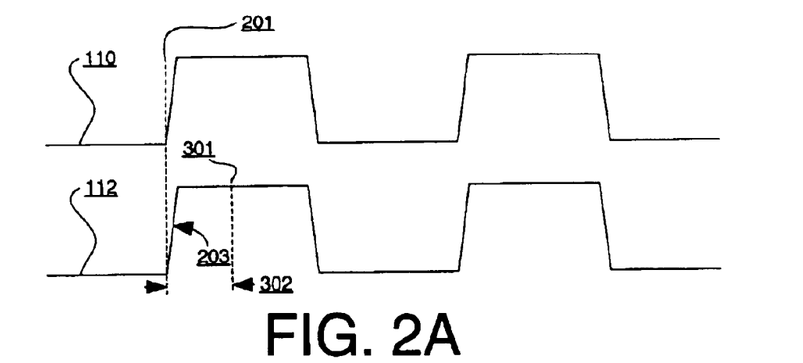
FIGS. 2A, 2B and 2C are respective signal timing diagrams depicting signals of the delay calibration system of FIG. 1 when a data signal and a clock signal are at least proximally aligned.
Figure 2B:
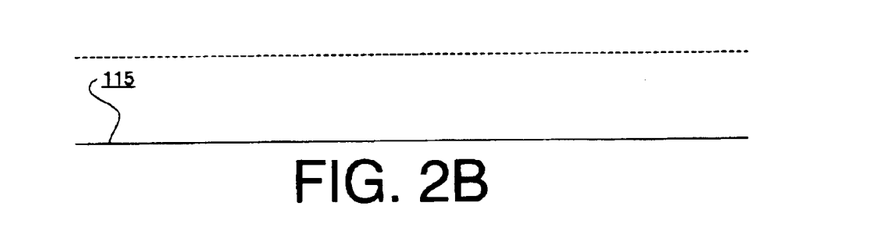
Figure 2C:
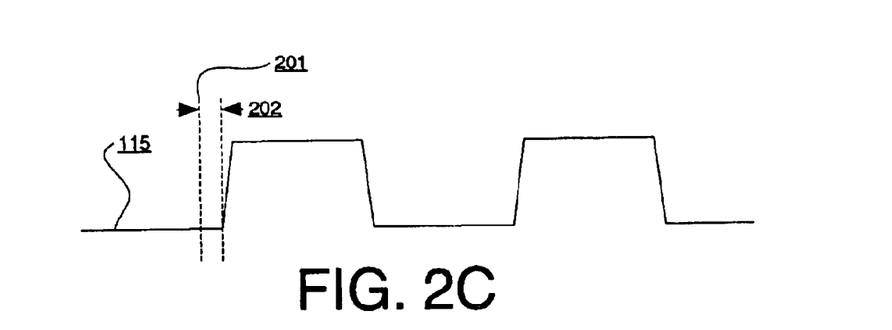

FIGS. 2A, 2B and 2C are respective signal timing diagrams depicting signals of delay calibration system 100 when data signal 110 and clock signal 112 are at least proximally aligned. FIGS. 2A, 2B and 2C are described with continuing reference to FIG. 1. Notably, signals input to delay flip-flop 104 are described in terms of positive, leading or rising edge triggered. However, as indicated above, delay flip-flop 104 with negative, trailing or falling edge triggering may be used.

Signals 110, 112 are at least proximally edge aligned at time 201, as indicated in FIG. 2A. Thus, output signal 115 of delay flip-flop 104 will register a logic zero, as indicated in FIG. 2B. It is possible for exact alignment of edges of signals 110 and 112 that output signal 115 will be meta stable, namely, transition along with data signal 110 between high and low logic levels, such as logic zero and logic one states, as indicated in FIG. 2C. Notably, there may be some delay 202 due to clock-to-out delay of delay flip-flop 104. Additionally, just because output signal 115 has a voltage level for a logic zero value does not necessarily mean that signals 110, 112 are aligned within a target range. Thus, for example, as long as an edge, such as leading edge 203, of signal 112 is equal to or within a setup time window 302 for a register, such as a delay flip-flop 104, then an output such as in FIG. 2B or 2C is obtained.

Figure 3A:
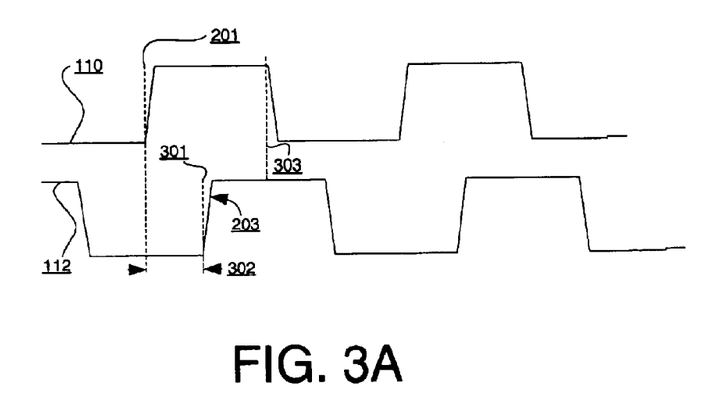
FIGS. 3A and 3B are respective signal timing diagrams depicting signals of the delay calibration system of FIG. 1 when a data signal and a clock signal are not at least proximally aligned.
Figure 3B:
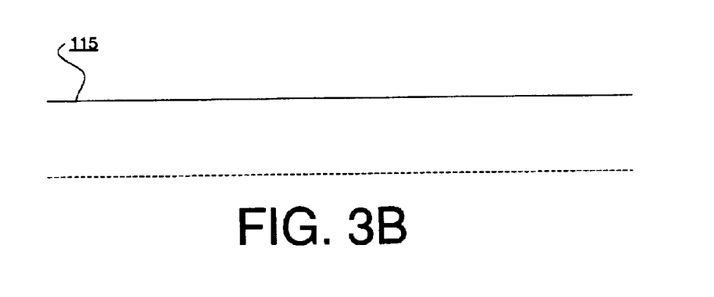

FIGS. 3A and 3B are respective signal timing diagrams depicting signals of delay calibration system 100 when data signal 110 and clock signal 112 are not at least proximally aligned. FIGS. 3A and 3B are described with continuing reference to FIG. 1. Notably, signals input to delay flip-flop 104 are described in terms of positive, leading or rising edge triggered. However, as indicated above, delay flip-flop 104 with negative, trailing or falling edge triggering may be used.

Signals 110, 112 are not at least proximally aligned at time 201, as indicated in FIG. 3A. Rather, signals 110, 112 are separated by the time difference of time 301 less time 201. This time difference between 201 and 301 means that data signal 110 leads clock signal 112 in this example. Data signal 110 may lead clock signal 112. When delay 302 is sufficient for setup time of delay flip-flop 104 to be met, output signal 115 of delay flip-flop 104 will be a high logic level, such as logic one, as indicated in FIG. 3B. In other words, edge 203 of signal 112 is now outside a setup time window, and thus an output as in FIG. 3B is obtained. Notably, there is some minimum hold time to be met for delay flip-flop 104. In this example, hold time might be measured from time 301 to time 303, though this is not necessarily a minimum hold time for flip-flop 104. However, as alignment of data signal and clock signal edges is controlling and hold time for conventional delay flip-flops is negligible in many applications, only setup time is considered here.

Registering a logic one for output signal 115 may be expressed mathematically for incorporation into control circuit 105, as $$Tvad+Tcuc+Tpd>Tsu \quad (1)$$

where: Tvad is delay through variable delay circuit 102; Tcuc is delay due to circuitry under calibration 103; Tsu is setup time of delay flip-flop 104; and Tpd is a route delay difference between data and clock into delay flip-flop 104, namely, a trace delay difference between data signal 110 and clock signal 112.

Figure 4:
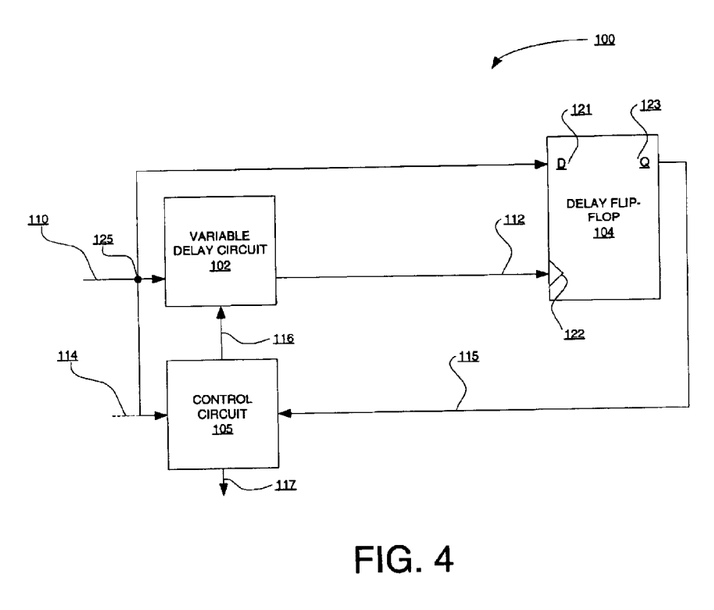
FIG. 4 is a block diagram depicting an exemplary embodiment of delay calibration system where a circuit under calibration is excluded.

For delay calibration system 100 incorporated in a PLD, circuit under calibration 103 may be programmably included or excluded from delay calibration system 100. FIG. 4 is a block diagram depicting an exemplary embodiment of delay calibration system 100 where circuit under calibration 103 is excluded. From Equation (1), if Tvad were zero, clock signal 112 and data signal 110 will be coincident at input to delay flip-flop 104 except for Tpd. Accordingly, setup time, Tsu, may be determined from, $$Tsu+Tpd=Tvad. \quad (2)$$

In other words, Tvad is adjusted via variable delay circuit 102 in response to delay adjust signal 116 such that output transitions from logic zero or a meta stable state to logic one. Assuming Tpd to be negligible, the value of Tvad, namely, the total variable delay imposed to cause the transition as indicated by total delay signal 117, is approximately equal to Tsu. Thus, setup time for delay flip-flop 104 may be determined.

Figure 5:
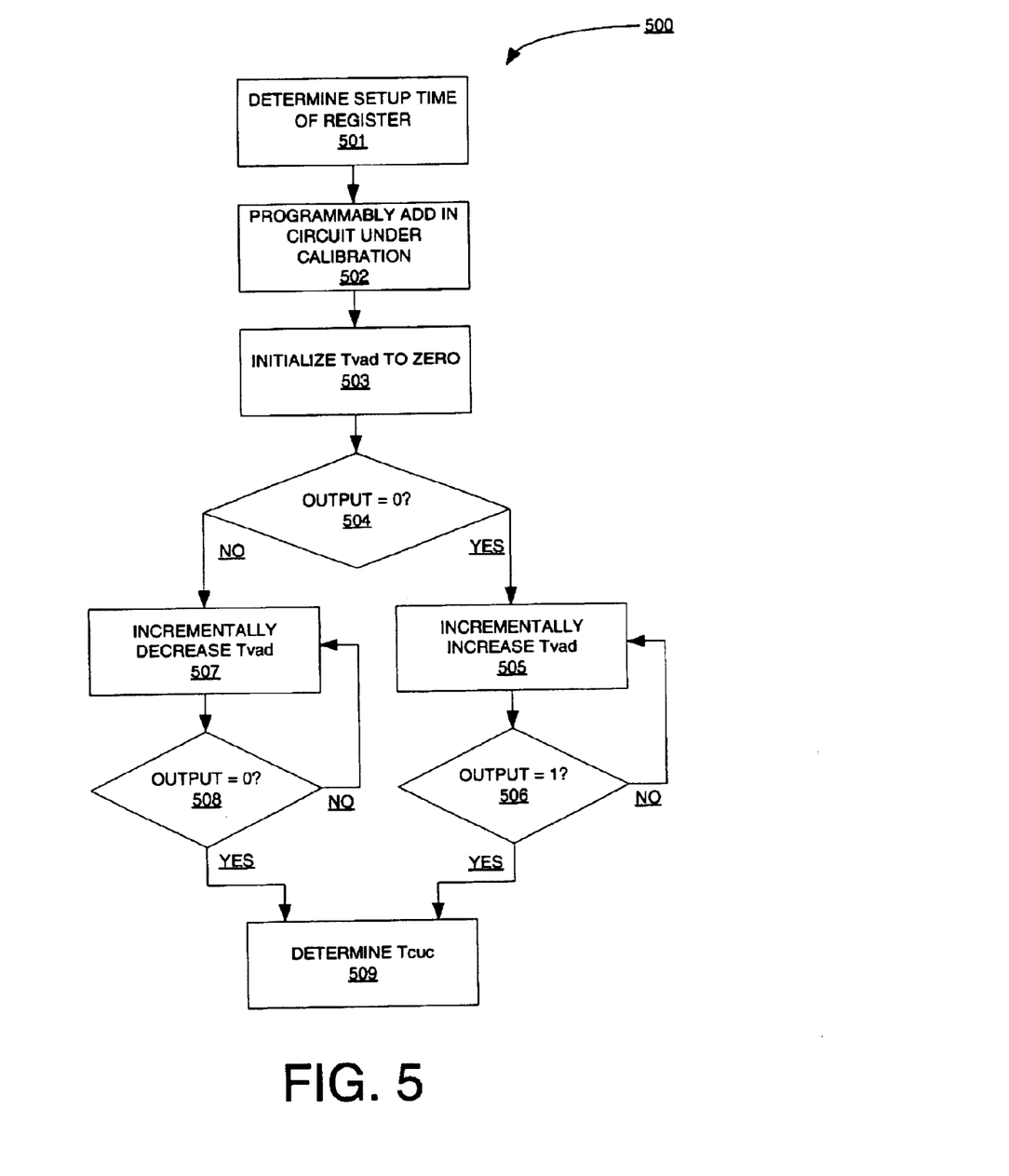
FIG. 5 is a flow diagram depicting an exemplary embodiment of a delay calibration flow for an integrated circuit having programmable logic.

For purposes of clarity, it is assumed that a logic zero is a logic zero state or a meta stable state with reference to FIG. 5. FIG. 5 is a flow diagram depicting an exemplary embodiment of a delay calibration flow 500 for an integrated circuit having programmable logic. Delay calibration flow 500 is described with renewed reference to FIG. 1.

At 501, a setup time for a register is determined, such as a delay flip-flop 104. Setup time may be determined as described with reference to FIG. 4.

At 502, a circuit under calibration is programmably coupled to be part of delay calibration system 100, as shown in FIG. 1. Notably, circuitry under calibration may be dedicate or application specific circuitry or may be configurable circuitry or a combination thereof.

At 503, Tvad is initialized as zero delay. In an embodiment, clock signal 110 passes through variable delay circuit 102 without any incremental delay step added for initialization. However, in another embodiment, Tvad initialized to zero may be located at some location, other than zero added delay. In other words, this is just a reference starting location.

At 504, it is determined whether output signal 115 has a logic zero value. If output signal 115 does have a logic zero value, then Tvad is incrementally increased at 505, for example by providing a delay adjust signal 116 for a stepwise increase in delay of variable delay circuit 102.

At 506, it is determined whether the incremental increase at 505 caused output of delay flip-flop 104 to be a logic one value. If output signal 115 is not a logic one value, then Tvad is increased again at 505. This loop continues until output signal 115 is a logic one value.

At 504, it is determined whether output signal 115 has a logic zero value. If output signal 115 does not have a logic zero value, namely, output signal 115 has a logic one value, then Tvad is incrementally decreased at 507, for example by providing a delay adjust signal 116 for a stepwise decrease in delay of variable delay circuit 102.

At 508, it is determined whether the incremental decrease at 507 caused output of delay flip-flop 104 to be a logic zero value. If output signal 115 is not a logic zero value, then Tvad is decrease again at 507. This loop continues until output signal 115 is a logic zero value.

From a logic zero value at 504, at 509 Tcuc is determined as, $$Tcuc=Tsu+Tvad. \quad (3A)$$

In other words, Tcuc is determined from Equation 3A for a logic one to logic zero transition. Equation 3B, below, is used to determine Tcuc for a logic zero to logic one transition. From a logic one value at 504, at 505 Tcuc is determined as, $$Tcuc=Tsu-Tvad. \quad (3B)$$

Tvad is obtained as output signal 117 from control circuit 105. Tvad is the magnitude of the difference between starting and ending values of delay, such as Tvad after either a change from logic zero to logic one, or from logic one to logic zero. In other words, Tvad is the amount of delay added or subtracted to cause output signal 115 to change state. Again, there is an error margin due to quanta of increment between different delay values of Tvad.

Figure 6:
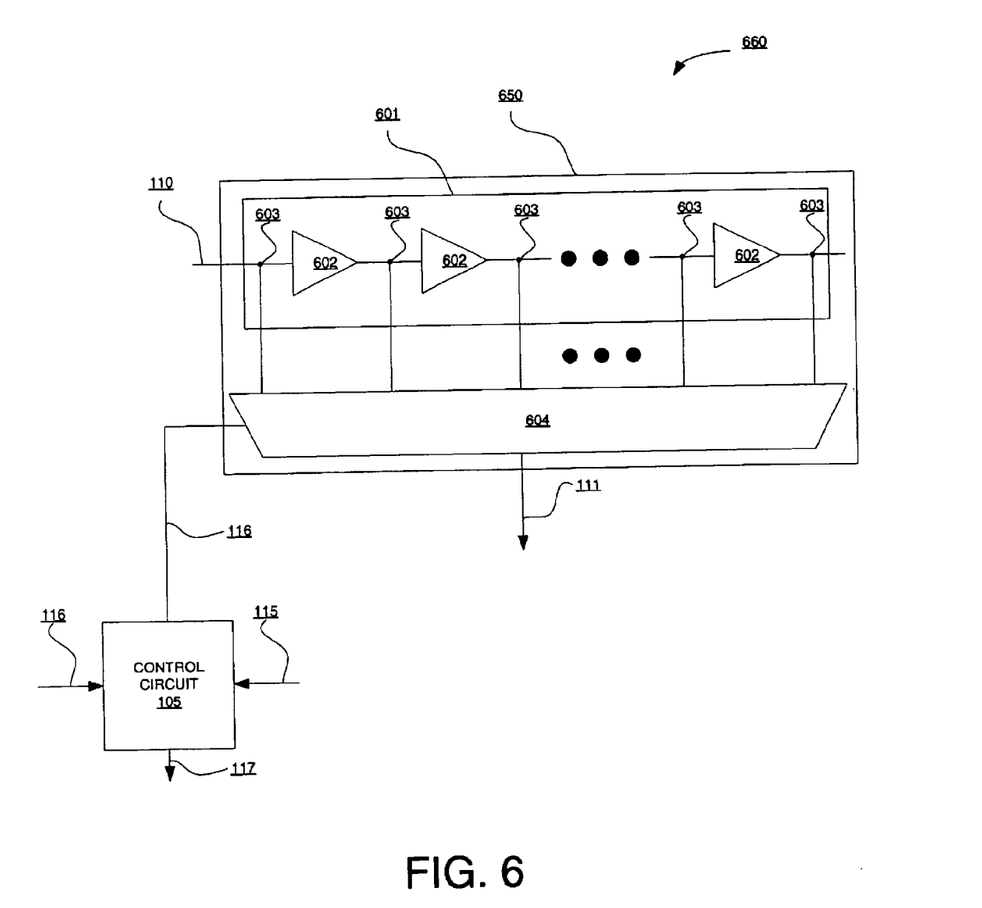
FIG. 6 is a block/schematic diagram depicting an exemplary embodiment of a portion of the delay calibration system of FIG. 1.

FIG. 6 is a block/schematic diagram depicting an exemplary embodiment of a portion of delay calibration system 100 of FIG. 1. Delay line 601 is connected to a multiplexer 604. Delay adjust signal 116 is provided to multiplexer 604 as a select signal. Clock signal 110 is provided to delay line 601 as a signal input. Delay line 601 includes a plurality of buffers 602 connected in series with taps 603 between buffers 602 and taps located at the ends of delay line 601. Taps 603 are connected to multiplexer 604. In response to delay adjust signal 116, an input to multiplexer 604 from one of taps 603 is selected for clock output signal 111. Accordingly, the amount of delay of clock signal 110 used to provide clock signal 111 is dependent on which tap 603 is selected.

Notably, delay line 601 and multiplexer 604 may be part of a DCM 650 of a PLD 660. Accordingly, delay line 601 and multiplexer 604 may be programmably coupled to form a portion of delay calibration system 100, and then uncoupled when done with calibration.

Figure 7:
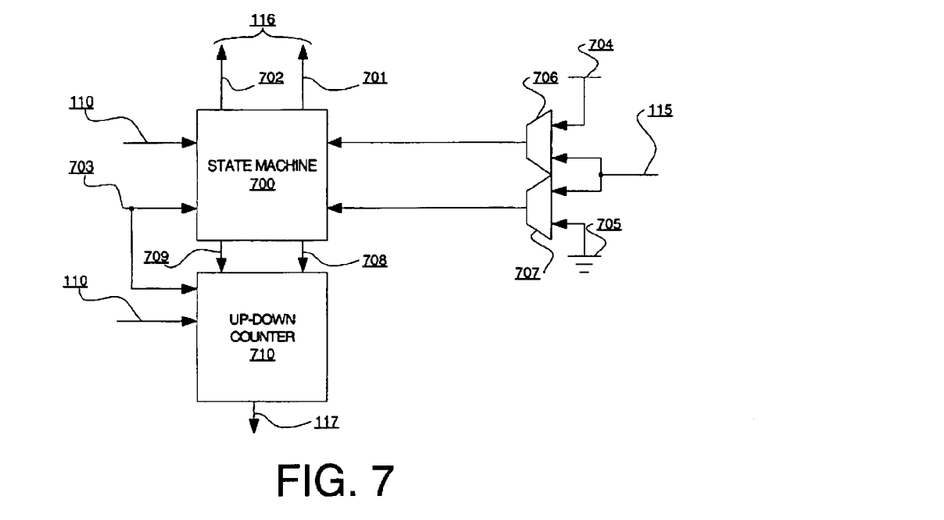
FIG. 7 is a block diagram depicting an exemplary embodiment of a control circuit.

FIG. 7 is a block diagram depicting an exemplary embodiment of control circuit 105. Control circuit includes state machine 700, up-down counter 710, and comparators 706 and 707. Clock signal 110 is provided to state machine 700 and up-down counter 710 for operation. Output signal 115 is provided as input to comparators 706 and 707. Another input of comparator 706 is tied to a high logic level voltage 704, and another input of comparator 707 is tied to a low logic level voltage 705. Thus, comparator 706 provides an output of a logic one to state machine 700 when output signal 115 is a logic one, and comparator 707 provides an output of a logic zero to state machine 700 when output signal 115 is a logic zero.

These outputs of comparators 706 and 707 are used to increment or decrement a tap of delay line 601 of FIG. 6. State machine 700 in response to an initial logic 0 output from comparator 707 increases Tvad by one tap at a time by providing an increment delay 701 of delay adjust signal 116 until state machine 700 receives a logic 1 output from comparator 706. State machine 700 in response to an initial logic 1 output from comparator 706 decreases Tvad by one tap at a time by providing an decrement delay 702 of delay adjust signal 116 until state machine 700 receives a logic 1 output from comparator 706.

Each time a tap is incremented or decremented, state machine 700 provides a respective increment or decrement the count signal 709. Because state machine 700 and up-down counter 710 are clocked, such as using clock signal 110, each increment or decrement is clocked into a total count of up-down counter 710. Once a change in state of output signal 115 is detected by state machine 700, a last increment or decrement is counted and a control signal 709 is provided by state machine 700 to up-down counter 710. In response to control signal 709, up-down counter 710 outputs total delay signal 117, namely, a total count of taps and an indication of direction. A reset signal 703 may be used to reset state machine 700 and up-down counter 710. Notably, state machine 700 may be formed using configurable logic of PLD 660 of FIG. 6, and then undone when calibration is completed.

Figure 8:
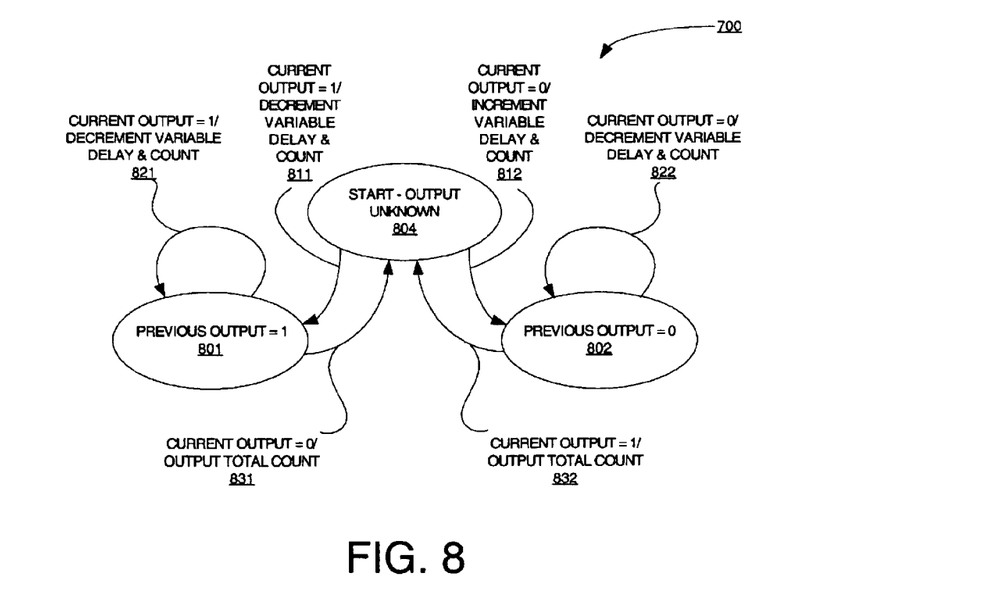
FIG. 8 is a state diagram depicting an exemplary embodiment of a state machine of FIG. 7.

FIG. 8 is a state diagram depicting an exemplary embodiment of state machine 700 of FIG. 7. State machine starts in an output unknown state 804, namely, state of output signal 115 has yet to be determined. Notably, reset has not been shown in this state diagram for purposes of clarity; however, state machine 700 may be put in output unknown state 804 in response to reset signal 703.

From output unknown state 804, either a logic 1 or 0 will be detected as a current output for output signal 115. If a logic 1 is detected, variable delay 102 of FIG. 1 is decremented at 811, and state machine 700 transitions from start state 804 to previous output equal to logic 1 state 801. If, however, a logic 0 is detected, variable delay 102 of FIG. 1 is incremented at 812, and state machine 700 transitions from start state 804 to previous output equal to logic zero state 802.

State machine 700 stays in previous output equal to logic 1 state 801 for each subsequent clock cycle 821 that a current output equals a logic 1. For each subsequent clock cycle 821 that a current output equals a logic 1, variable delay 102 of FIG. 1 is decremented. Each decrement for transition 811 and for each non-state transition 821, a decrement count signal is sent to up-down counter 710. If, while in previous output equal to logic 1 state 801, a current output equal to logic 0 is detected, state machine 700 transitions from state 801 to start state 804 and sends a signal to up-down counter 710 to output the total count at 831.

State machine 700 stays in previous output equal to logic 0 state 802 for each subsequent clock cycle 822 that a current output equals a logic 0. For each subsequent clock cycle 822 that a current output equals a logic 0, variable delay 102 of FIG. 1 is incremented. Each increment for transition 812 and for each non-state transition 822, an increment count signal is sent to up-down counter 710. If, while in previous output equal to logic 0 state 802, a current output equal to logic 1 is detected, state machine 700 transitions from state 802 to start state 804 and sends a signal to up-down counter 710 to output the total count at 832.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for testing delay of logic circuitry, comprising:

obtaining a reference clock signal;

incrementally delaying the reference clock signal to provide a delayed clock signal;

sending the delayed clock signal to the logic circuitry;

passing the delayed clock signal through the logic circuitry to obtain a calibration clock signal;

inputting the reference clock signal to a data port of a flip-flop;

inputting the calibration clock signal to a clock port of the flip-flop;

obtaining a data output signal from the flip-flop responsive to the reference clock signal and the calibration clock signal;

responsive to the data output signal, determining whether to increase or decrease delay of the calibration clock signal; and determining a total number of incremental changes in delay of the delayed clock signal.

2. The method, according to claim 1, further comprising responsive to the total number of incremental changes of the delayed clock signal, determining delay caused by the logic circuitry.

\* \* \* \* \*